United States Patent
Cheung et al.

(10) Patent No.: US 7,898,013 B2
(45) Date of Patent: Mar. 1, 2011

(54) INTEGRATED CIRCUITS AND METHODS WITH TWO TYPES OF DECOUPLING CAPACITORS

(75) Inventors: Brian Cheung, San Bruno, CA (US); Emmanuel De Muizon, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 114 days.

(21) Appl. No.: 11/967,778

(22) Filed: Dec. 31, 2007

(65) Prior Publication Data

US 2008/0237647 A1 Oct. 2, 2008

Related U.S. Application Data

(60) Provisional application No. 60/921,508, filed on Jan. 1, 2007, provisional application No. 60/934,937, filed on Jan. 1, 2007.

(51) Int. Cl.
*H01L 29/94* (2006.01)

(52) U.S. Cl. ........................ 257/296; 257/207; 257/297; 257/300; 257/E29.345; 257/E27.07

(58) Field of Classification Search ................. 257/202, 257/207, 288, 296, 297, E29.345, E27.07; 307/109, 110
See application file for complete search history.

(56) References Cited

U.S. PATENT DOCUMENTS

| | | | |
|---|---|---|---|
| 6,320,278 B1 * | 11/2001 | Nishiyama et al. | 307/53 |
| 6,844,771 B1 * | 1/2005 | Chen | 327/379 |
| 2003/0193771 A1 * | 10/2003 | Liao | 361/306.2 |
| 2005/0030057 A1 * | 2/2005 | Kim | 324/765 |

OTHER PUBLICATIONS

International Search Report mailed Jun. 25, 2008, for International Application No. PCT/US2007/089216.
Written Opinion of the International Searching Authority mailed on Jun. 25, 2008, for International Application No. PCT/US2007/089216.

* cited by examiner

*Primary Examiner* — N Drew Richards
*Assistant Examiner* — Mamadou Diallo
(74) *Attorney, Agent, or Firm* — Brinks Hofer Gilson & Lione

(57) ABSTRACT

Methods and systems for optimal decoupling capacitance in a dual-voltage power-island architecture. In low-voltage areas of the chip, accumulation capacitors of two different types are used for decoupling, depending on whether the capacitor is located in an area which is always-on or an area which is conditionally powered.

14 Claims, 2 Drawing Sheets

INTEGRATED CIRCUITS AND METHODS WITH TWO TYPES OF DECOUPLING CAPACITORS

CROSS-REFERENCE TO OTHER APPLICATION

Priority is claimed from U.S. provisional application 60/921,508 (formerly numbered as Ser. No. 11/618,912), and also from U.S. provisional application 60/934,937 (formerly numbered as Ser. No. 11/618,913), both filed on Jan. 1, 2007, and both hereby incorporated by reference.

BACKGROUND

The present application relates to low-power integrated circuits which use power islands, and more particularly to the implementation of decoupling capacitance in such circuits.

Decoupling capacitors are often used in chip design to reduce noise during switching. In the logic areas filler cells which include capacitors connected between power and ground are typically used. As voltage scaling progresses, and devices become increasingly sensitive to transient overvoltages, control of switching noise becomes increasingly desirable.

However, a conflicting trend is the demand for lower off-state leakage. Decoupling capacitors are commonly implemented as simple accumulation capacitors. While the gate oxide provided by a deeply scaled process allows a very high specific capacitance, it also provides a relatively high leakage current density.

The leakage density of gate oxides is currently scaling unfavorably. Thus as processes continue to scale to smaller dimensions, the traditional approach to decoupling capacitors provides leakage current densities which are unacceptable.

Many portable electronic systems are critically limited by battery life. For example, users do not like heavy cell phones, but users also do not like their cell phones to run out of power and shut down. One way to improve battery life is to increase the energy efficiency of the electronics components in the portable system. Power consumption when a portable system is active is an important component of battery life, but another is power consumption when the system is in standby.

Power islands are a common technique in low-power design. Power islands help to reduce standby current by keeping powered only the circuit sections that are needed during sleep or standby operation.

SUMMARY

The present inventors have realized that optimization of decoupling capacitors can be improved by taking account of the distinction between the always-on and sometimes-on sections of the chip.

The present application discloses new approaches to decoupling capacitors, which are especially applicable to integrated circuits in which two (or more) oxide thicknesses are used (as is common highly scaled products). For example, a thinner effective gate oxide is commonly used for the core logic than for the peripheral circuits; this allows the core logic to be optimally scaled, while adding some robustness to the peripheral circuits.

The present application teaches that power island architecture opens new possibilities for decoupling capacitors. According to one class of embodiments, the thinnest gate oxides are used for decoupling capacitors, within the lowest-voltage domain, only in locations which are conditionally powered, and not in locations which are always powered.

According to another class of embodiments, some or all of the decoupling capacitors in conditionally-powered locations are density-optimized, while the decoupling capacitors in always-powered locations are leakage-optimized. According to another class of embodiments, some or all of the decoupling capacitors in conditionally-powered locations are formed from the lowest-voltage gate oxide layer, while the decoupling capacitors in always-powered locations are formed from a higher-voltage gate oxide layer.

The core gate oxide thickness is typically thinner that than the I/O gate oxide thickness and thus provides a better capacitance to area ratio than the I/O gate oxide thickness. However, for deep submicron technologies a significant amount of current may flow through the gate oxide (direct tunneling). The thicker I/O gate oxide has a lower capacitance to area ratio but also uses much less gate current. A difference of several orders of magnitude in gate leakage current is not uncommon for sub-micron technologies.

Thus a capacitor with core oxide thickness has a better capacitance to area ratio but has higher gate leakage current. A capacitor built with I/O oxide thickness has a lower capacitance to area ratio but a much lower gate leakage current.

The disclosed innovations, in various embodiments, provide one or more of at least the following advantages:
Reduced power consumption;
Greater density;
Better noise suppression;
Accumulation capacitors can still be used;
Special device structures are not needed for the decoupling capacitors; and
Better reliability.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION

Figure 1:
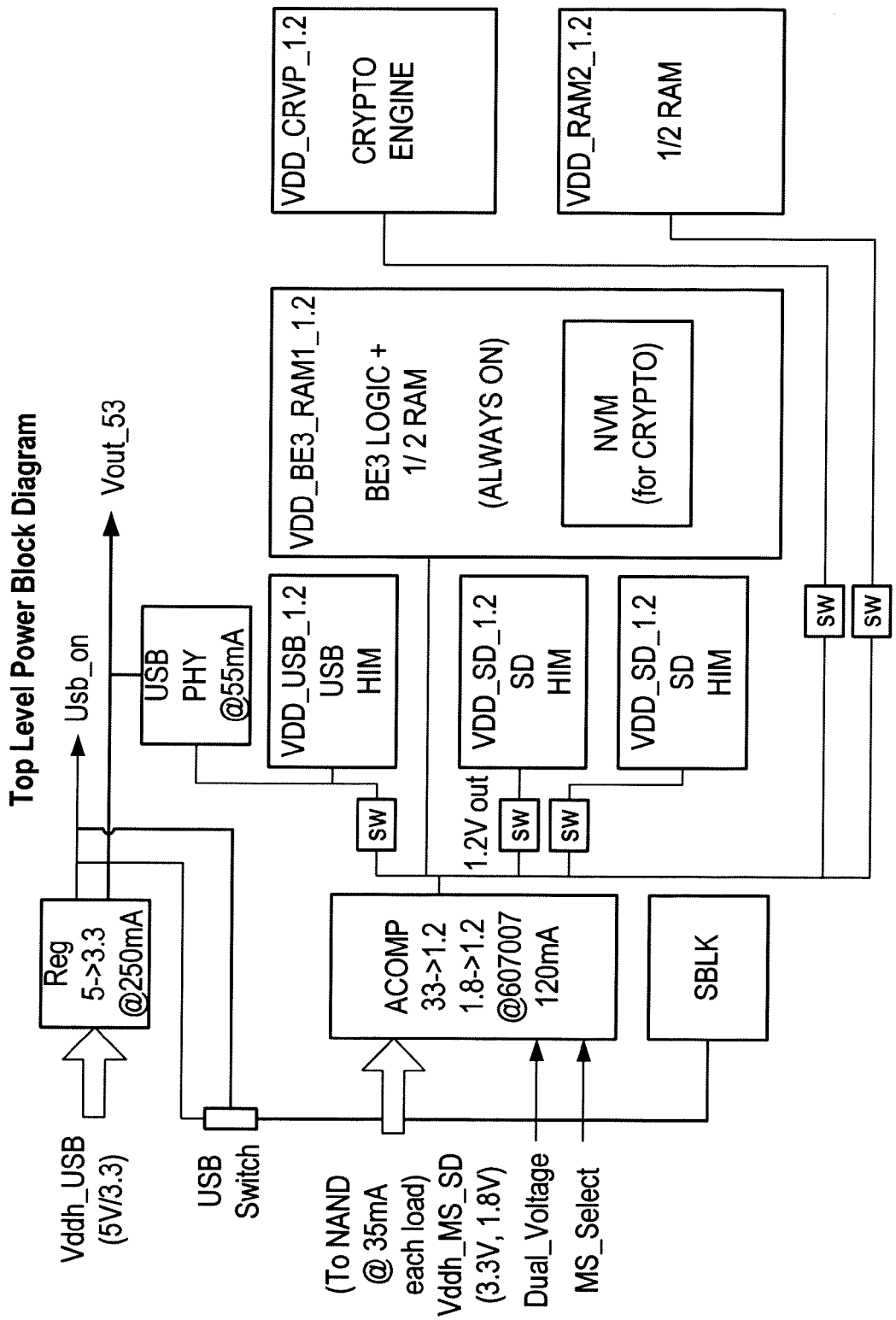
FIG. 1 shows an example of an integrated circuit, containing different areas which use different kinds of accumulation capacitors according to the preferred embodiment.

The numerous innovative teachings of the present application will be described with particular reference to presently preferred embodiments (by way of example, and not of limitation).

Decoupling capacitors are often used in chip design to reduce noise during switching. In the logic areas filler cells that includes capacitors connected between power and ground are typically used.

At least two oxide thicknesses are typically used for the manufacturing of sub-micron products: one used for the core and one for the IO circuits. Decoupling capacitors can be created from either oxide thickness yielding different properties.

The core gate oxide thickness is typically thinner than the IO gate oxide thickness, and thus provides a better capacitance to area ratio than the IO thickness. However for deep submicron technologies a significant amount of current may flow through the gate oxide (direct tunneling).

It is important to note that tunneling current is exponential with decreasing barrier thickness, regardless of barrier height. Thus the gate current density may become disproportionately worse with further scaling.

The thicker gate oxide used in IO circuits has a lower capacitance by area ratio but also uses much less gate current. A difference of several orders of magnitude in gate leakage current is not uncommon for sub-micron technologies.

Many modern low-power designs use power islands. One of the purposes of power islands is to reduce standby current by keeping powered only the circuit sections that are needed during the sleep or standby operation.

In order to minimize the gate current and consequently the standby current of a given product that uses power islands, thicker gate oxides are used to form decoupling capacitors in the sections of the circuit that are powered up during standby operation. Thinner gate oxide capacitors can be used in the sections of the circuit that are powered off during stand-by. This strategy allows an ASIC designer to minimize the leakage current in the sections that are powered on during standby while making the most efficient use of capacitance per chip area in the sections that are powered off during standby.

A sample implementation of these decoupling capacitors will now be described, in the context of a chip design referred to here as "Tripoli." In the Tripoli implementation using 0.13 μm transistor technology, N-well accumulation capacitors were used (N+ doped poly and source and drain inside an n-well).

For I/O oxide capacitors, 1 nF would use about 300K μm² area with only 5.1 nA gate leakage current. For core oxide capacitors, 1 nF would use about 150K μm² area while using 2.25 μA gate leakage current. Note that, while the area is reduced only by half, the leakage current is multiplied by a factor of about 400!

Filler cells of various areas were created with capacitance built-in. Both core and I/O oxide capacitor designs were created inside these filler cells. CAD software was then used to distribute the decoupling capacitance filler cells around the chip.

Specific filler cell locations are not illustrated, since their location is of no interest to the designer. That is, filler cells are inserted in a low level of specification, and have no strong relation to the human designer's decisions. For similar reasons, the device-level detail of any individual capacitor is not of particular interest either, since any one capacitor is the same as a conventional accumulation capacitor. Similarly, no one individual filler cell is greatly different from a conventional cell; it is the association between cell type and cell location, as described above, which produces such surprising advantages.

FIG. 1 shows an example of an integrated circuit, containing different areas which use different kinds of accumulation capacitors according to the preferred embodiment. In this figure the circuit operation of the individual blocks will not be discussed in detail, but the power connections are helpful in showing the application of the disclosed concepts.

In this figure the topmost block at the extreme right, labeled "Crypto engine," is an example of a low-voltage core block which is powered up only conditionally. In the illustrated ASIC, the crypto engine consumes a large amount of area, and also includes a large number of gates to permit fast computations. Since this block is powered up only as needed, and since it consumes a large fraction of the chip's total area, this block uses the densest coupling capacitors.

The block at the top center, labeled "USB PHY," is an IO (peripheral) block which does not use the thinnest gate oxides. Therefore this block would not be suitable for the thinnest coupling capacitors in any case.

The small white block at the lower center, which is embedded within a larger gray block and labeled "NVM for Crypto 1", is an example of a low-voltage core block which is always on. Since this block is not conditionally powered, it does not receive the thinner-oxide (density-optimized) capacitors, but instead receives thicker-oxide leakage-optimized capacitors.

Thus these three blocks together illustrate the way in which appropriate capacitance is selected, according to the preferred embodiment.

Figure 2:
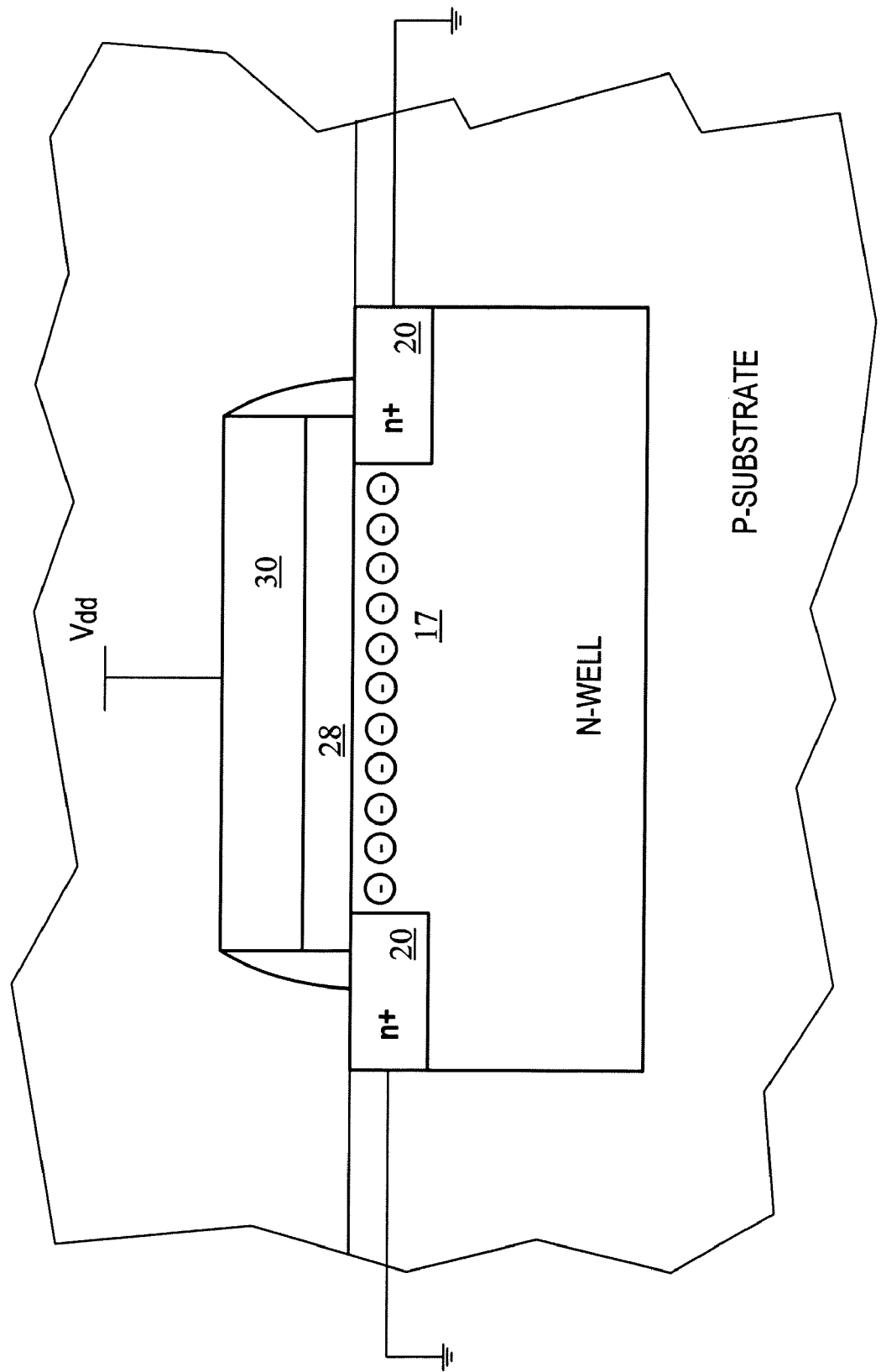
FIG. 2 shows one example of an accumulation capacitor structure which can be used, in two different versions, in the different locations discussed below.

FIG. 2 shows one example of an accumulation capacitor structure which can be used, in two different versions, in the different locations discussed below. A gate 30 (e.g. silicide over polysilicon) overlies a gate dielectric 28 (e.g. SiO2, or alternatively a higher-k dielectric), which overlies an n-well 17. N+ diffusions 20, which would provide NMOS source/drain diffusions in other locations, here permit the well to be tied to ground. When the gate 30 is tied to the positive supply voltage Vdd, carriers will accumulate at the interface between gate dielectric 28 and n-well 17. This structure provides a capacitance per unit area (of dielectric 28) which varies, as discussed above, inversely with the effective thickness of dielectric 28. Use of different materials for dielectric 28 may vary the exact relation between leakage and specific capacitance, but, for a given thin film structure type, thinner versions of dielectric 28 will result in higher capacitance and higher leakage.

According to various embodiments, there is provided: An integrated circuit comprising: first portions of active circuit area which are powered up only conditionally, and other portions of active circuit area which are powered up whenever the chip is powered up; wherein said first portions, but not said other portions, include decoupling capacitors which are predominantly of a first type; and wherein said other portions, but not said first portions, include decoupling capacitors which are predominantly of a second type; wherein said capacitors of said first type have a higher specific capacitance, and a higher leakage current per area, than said capacitors of said second type.

According to various embodiments, there is provided: An integrated circuit comprising: first portions of active circuit area which are powered up only conditionally, and other portions of active circuit area which are powered up whenever the chip is powered up; wherein said first portions, but not said other portions, include decoupling capacitors which are predominantly area-optimized; and wherein said other portions, but not said first portions, predominantly include decoupling capacitors which are leakage-optimized.

According to various embodiments, there is provided: an integrated circuit comprising: first portions which are powered up only conditionally, and other portions of active circuit area which are powered up whenever the chip is powered up from a power-off state; wherein said first portions and said other portions contain corresponding field-effect transistors having substantially identical gate structures; and wherein said first portions, but not said other portions, include decoupling capacitors which are predominantly accumulation capacitors and use substantially the same thin-film layers as said gate structures.

According to various embodiments, there is provided: An integrated circuit comprising: first areas including first insulated-gate transistors which are optimized for a first range of gate voltages; second areas including second insulated-gate transistors which are optimized for a second range of operating voltages, including some voltages which are higher than any part of said first range; said first areas including some portions which are powered up only conditionally, and other portions which are powered up whenever said first area is powered up; wherein said conditionally powered up portions include decoupling capacitors which are predominantly of a first type, and formed by the same process as said first transistors, and said other portions predominantly include decoupling capacitors which are not of said first type.

According to various embodiments, there is provided: A method for reducing electrical noise in an integrated circuit, comprising the actions of: loading power supply lines with a plurality of capacitors located at available locations within the chip; wherein ones of said capacitors located in the lowest voltage domain are leakage optimized, unless the capacitor is located in a domain which is powered only conditionally.

According to various embodiments, there is provided: A method for reducing electrical noise in an integrated circuit, comprising the actions of: loading power supply lines with a plurality of capacitors located at available locations within the chip; wherein ones of said capacitors located in the lowest voltage domain do not use the thinnest gate oxide, unless the capacitor is located in a domain which is powered only conditionally; and wherein at least some ones of said capacitors which are located in the lowest voltage domain use the same gate oxide as the lowest-voltage insulated-gate transistors on chip.

According to various embodiments, there are provided: Methods and systems for optimal decoupling capacitance in a dual-voltage power-island architecture. In low-voltage areas of the chip, accumulation capacitors of two different types are used for decoupling, depending on whether the capacitor is located in an area which is always-on or an area which is conditionally powered.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, the disclosed inventions can be even more advantageous in processes where more than two gate oxide thicknesses are available; in such cases the tradeoffs described above can be exponentially more refined.

Reference is also made to the following commonly owned and copending U.S. Patent Applications, each and every one of which is hereby incorporated by reference in its entirety: 60/934,936 filed Dec. 31, 2006; 60/921,507 filed Dec. 31, 2006; 60/934,918 filed Dec. 31, 2006; 60/934,917 filed Dec. 31, 2006; 60/999,760 filed Dec. 31, 2006; 60/934,923 filed Dec. 31, 2006; 60/934,937 filed Jan. 1, 2007; 60/921,508 filed Jan. 1, 2007; Ser. No. 11/618,849 filed Dec. 31, 2006; Ser. No. 11/618,852 filed Dec. 31, 2006; Ser. No. 11/618,865 filed Dec. 31, 2006; Ser. No. 11/618,867 filed Dec. 31, 2006; Ser. No. 11/649,325 filed Dec. 31, 2006; Ser. No. 11/649,326 filed Dec. 31, 2006; Ser. No. 11/965,943 filed Dec. 28, 2007; Ser. No. 11/966,012 filed Dec. 28, 2007; and Ser. No. 11/966,147 filed Dec. 28, 2007. None of these applications are necessarily related to the present application, but many of these these help to show features which were designed into the same system as the ideas described above, and/or which combine synergistically with those ideas. Some ones of these copending applications may have overlapping inventorship with the present application, and hence be eligible for a domestic priority claim under U.S. law, but priority is not necessarily claimed nor disclaimed at this time.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. An integrated circuit comprising:
   first portions of active circuit area which are powered up only conditionally, and
   other portions of active circuit area which are powered up whenever the integrated circuit is powered up;
   wherein said first portions, but not said other portions, include decoupling capacitors which are predominantly of a first type; and
   wherein said other portions, but not said first portions, include decoupling capacitors which are predominantly of a second type;
   wherein said capacitors of said first type have a higher specific capacitance, and a higher leakage current per area, than said capacitors of said second type.

2. The integrated circuit of claim 1, wherein said first and second types of capacitors both have conductor and insulator layers overlying a semiconductor region, and wherein said first type capacitors have thinner insulator layers than said second type capacitors.

3. The integrated circuit of claim 1, wherein said first and second types of capacitors are both MOS capacitors.

4. The integrated circuit of claim 1, wherein said first and second types of capacitors are both accumulation capacitors.

5. The integrated circuit of claim 1, wherein said first and second types of capacitors are both MOS capacitors to n-well.

6. An integrated circuit comprising:
   first portions of active circuit area which are powered up only conditionally, and
   other portions of active circuit area which are powered up whenever the integrated circuit is powered up;
   wherein said first portions, but not said other portions, include decoupling capacitors which are predominantly area-optimized; and
   wherein said other portions, but not said first portions, predominantly include decoupling capacitors which are leakage-optimized.

7. The integrated circuit of claim 6, wherein said area-optimized and said leakage-optimized capacitors both have conductor and insulator layers overlying a semiconductor region, and wherein said area-optimized capacitors have thinner insulator layers than said leakage-optimized capacitors.

8. The integrated circuit of claim 6, wherein said area-optimized and said leakage-optimized capacitors are both MOS capacitors.

9. The integrated circuit of claim 6, wherein said area-optimized and said leakage-optimized capacitors are both MOS capacitors to n-well.

10. An integrated circuit comprising: first portions which are powered up only conditionally, and other portions of active circuit area which are powered up whenever the chip is powered up from a power-off state; wherein said first portions and said other portions contain corresponding field-effect transistors having substantially identical gate structures; and
    wherein said first portions, but not said other portions, include decoupling capacitors which are predominantly accumulation capacitors and use substantially the same thin-film layers as said gate structures;

wherein said other portions, but not said first portions, include decoupling capacitors which are predominantly accumulation capacitors and which do not use the same thin-film layers as said gate structures.

11. An integrated circuit comprising:

first areas including first insulated-gate transistors which are optimized for a first range of gate voltages;

second areas including second insulated-gate transistors which are optimized for a second range of operating voltages, including some voltages which are higher than any part of said first range;

said first areas including some portions which are powered up only conditionally, and other portions which are powered up whenever said first area is powered up;

wherein said conditionally powered up portions include decoupling capacitors which are predominantly of a first type, and formed by the same process as said first transistors, and said other portions predominantly include decoupling capacitors which are not of said first type.

12. The integrated circuit of claim 11, wherein said conditionally powered up portions, but not said other portions, include decoupling capacitors which are predominantly of a first type, and formed by the same process as said first transistors; and said other portions predominantly include decoupling capacitors which are formed by the same process as said second transistors.

13. The integrated circuit of claim 11, wherein said other portions, but not said conditionally powered up portions, include decoupling capacitors which are predominantly accumulation capacitors and which do not use the same thin-film layers as said gate structures.

14. The integrated circuit of claim 11, wherein said second areas include external I/O circuits, and said first areas do not.

* * * * *